United States Patent
Long et al.

(12)

(10) Patent No.: US 8,062,427 B2
(45) Date of Patent: Nov. 22, 2011

(54) PARTICULATE MATERIAL METERING AND VAPORIZATION

(75) Inventors: Michael Long, Hilton, NY (US); Thomas W. Palone, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 614 days.

(21) Appl. No.: 12/271,211

(22) Filed: Nov. 14, 2008

(65) Prior Publication Data
US 2010/0122656 A1    May 20, 2010

(51) Int. Cl.
| | |
|---|---|
| C23C 16/448 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl. .............. 118/726; 156/345.29; 118/723 VE
(58) Field of Classification Search ............ 118/723 VE, 118/726; 156/345.29
See application file for complete search history.

(56) References Cited

U.S. PATENT DOCUMENTS

| | | | | |
|---|---|---|---|---|
| 2,190,592 | A * | 2/1940 | Clayton | 252/367.1 |
| 2,191,255 | A * | 2/1940 | Bonotto | 34/493 |
| 2,233,109 | A * | 2/1941 | Ness et al. | 48/38 |
| 2,241,425 | A * | 5/1941 | Schmidt | 239/218.5 |
| 2,392,764 | A * | 1/1946 | Reeves | 208/153 |
| 2,447,789 | A | 8/1948 | Barr | |
| 2,665,168 | A * | 1/1954 | Kerlin | 239/2.1 |
| 2,743,158 | A * | 4/1956 | Webb et al. | 423/257 |
| 2,771,836 | A * | 11/1956 | Denehie et al. | 99/323.7 |
| 3,754,529 | A * | 8/1973 | Fleischner | 118/726 |
| 4,532,272 | A * | 7/1985 | Wilt et al. | 523/330 |
| 4,616,055 | A * | 10/1986 | Mason | 524/381 |
| 4,769,292 | A | 9/1988 | Tang et al. | |
| 4,885,211 | A | 12/1989 | Tang et al. | |
| 5,090,498 | A * | 2/1992 | Hamill | 175/206 |
| 5,709,827 | A * | 1/1998 | Andersen et al. | 264/42 |

(Continued)

FOREIGN PATENT DOCUMENTS
EP    0982411    3/2000
(Continued)

OTHER PUBLICATIONS
V.E. Danilchenko, et al. "Method of Discrete Evaporation in Vacuo," Instruments and Experimental Techniques, Institute of Physics, Academy of Sciences of the Ukrainian SSR, Kiev, May-Jun. 1968.

*Primary Examiner* — Rudy Zervigon
(74) *Attorney, Agent, or Firm* — Morgan, Lewis & Bockius LLP

(57) ABSTRACT

Apparatus for metering and vaporizing a particulate material, includes a metering device for metering particulate material including: a reservoir for receiving particulate material; a housing having an internal volume and having first and second openings; a rotatable shaft disposed in the internal volume, the shaft having a smooth surface and a circumferential groove; a structure disposed in the reservoir for delivery and cooperating with the rotating shaft for fluidizing particulate material and transporting it from the reservoir into the groove; the shaft and internal volume cooperating such that particulate material is transported by the groove; a scraper cooperates with the groove to dislodge particulate material retained therein and fluidize the scraped particulate material, and deliver metered amounts of particulate material through the second opening; and a flash evaporator that receives and flash vaporizes the metered particulate material.

5 Claims, 7 Drawing Sheets

U.S. PATENT DOCUMENTS

| | | | |
|---|---|---|---|
| 6,383,301 B1 * | 5/2002 | Bell et al. | 118/716 |
| 6,470,737 B1 * | 10/2002 | De Bona et al. | 73/64.56 |
| 6,685,762 B1 * | 2/2004 | Brewster et al. | 75/331 |
| 6,734,142 B2 * | 5/2004 | Massmann et al. | 504/206 |
| 6,832,887 B2 | 12/2004 | Baer et al. | |
| 7,044,288 B2 | 5/2006 | Baer et al. | |
| 7,141,532 B2 * | 11/2006 | Graham et al. | 504/206 |
| 7,288,285 B2 * | 10/2007 | Long et al. | 427/248.1 |
| 7,288,286 B2 * | 10/2007 | Long et al. | 427/248.1 |
| 7,501,151 B2 * | 3/2009 | Long et al. | 427/248.1 |
| 7,501,152 B2 * | 3/2009 | Long et al. | 427/248.1 |
| 7,625,601 B2 * | 12/2009 | Long et al. | 427/248.1 |
| 7,625,602 B2 * | 12/2009 | Long et al. | 427/248.1 |
| 7,638,168 B2 * | 12/2009 | Boroson et al. | 427/248.1 |
| 2006/0062915 A1 * | 3/2006 | Long et al. | 427/248.1 |
| 2006/0062918 A1 * | 3/2006 | Long et al. | 427/255.6 |
| 2006/0062919 A1 * | 3/2006 | Long et al. | 427/255.6 |
| 2006/0157322 A1 | 7/2006 | Baer et al. | |
| 2006/0177576 A1 | 8/2006 | Long et al. | |
| 2006/0251811 A1 * | 11/2006 | Long et al. | 427/248.1 |
| 2007/0026146 A1 * | 2/2007 | Long et al. | 427/248.1 |
| 2007/0084700 A1 | 4/2007 | Baer et al. | |
| 2007/0092645 A1 * | 4/2007 | Long et al. | 427/248.1 |
| 2007/0104864 A1 * | 5/2007 | Boroson et al. | 427/184 |
| 2009/0081365 A1 * | 3/2009 | Cok et al. | 427/255.6 |
| 2009/0176016 A1 * | 7/2009 | Long et al. | 427/248.1 |
| 2010/0122656 A1 * | 5/2010 | Long et al. | 118/712 |
| 2010/0122658 A1 * | 5/2010 | Long et al. | 118/724 |
| 2010/0122659 A1 * | 5/2010 | Long et al. | 118/726 |

FOREIGN PATENT DOCUMENTS

JP    2003 193218 A    7/2003

* cited by examiner

Figure 1:
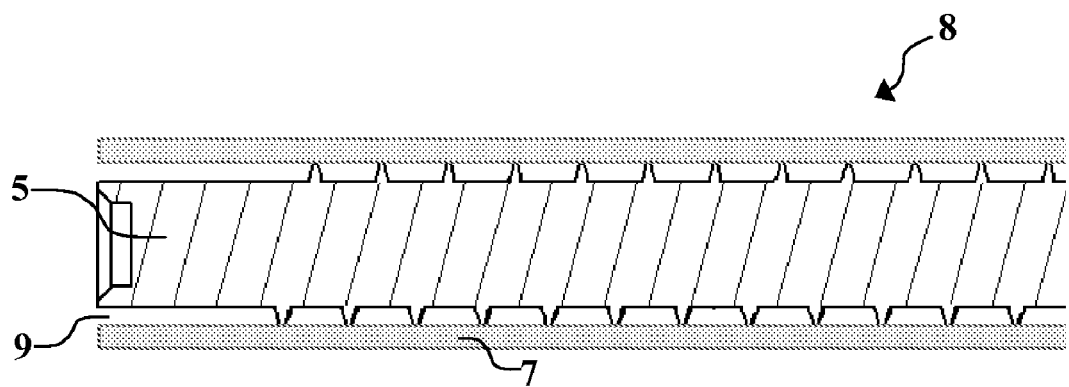
Figure 2:
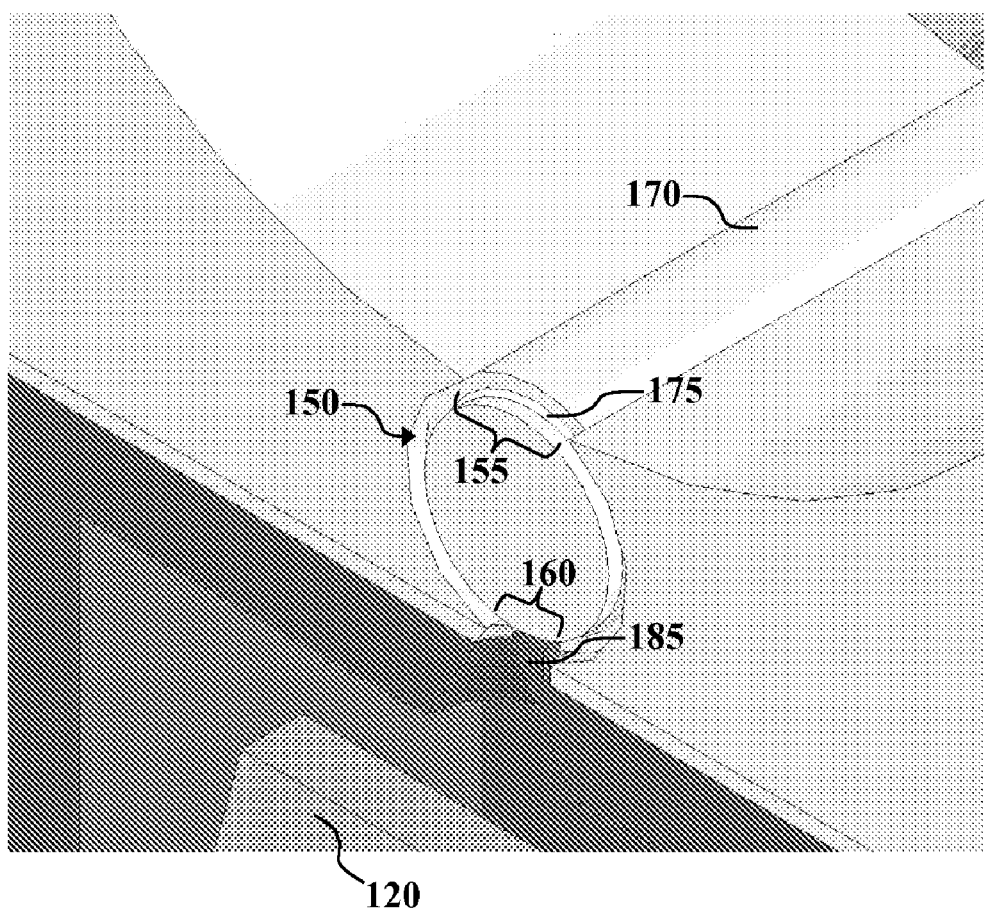
Figure 3:
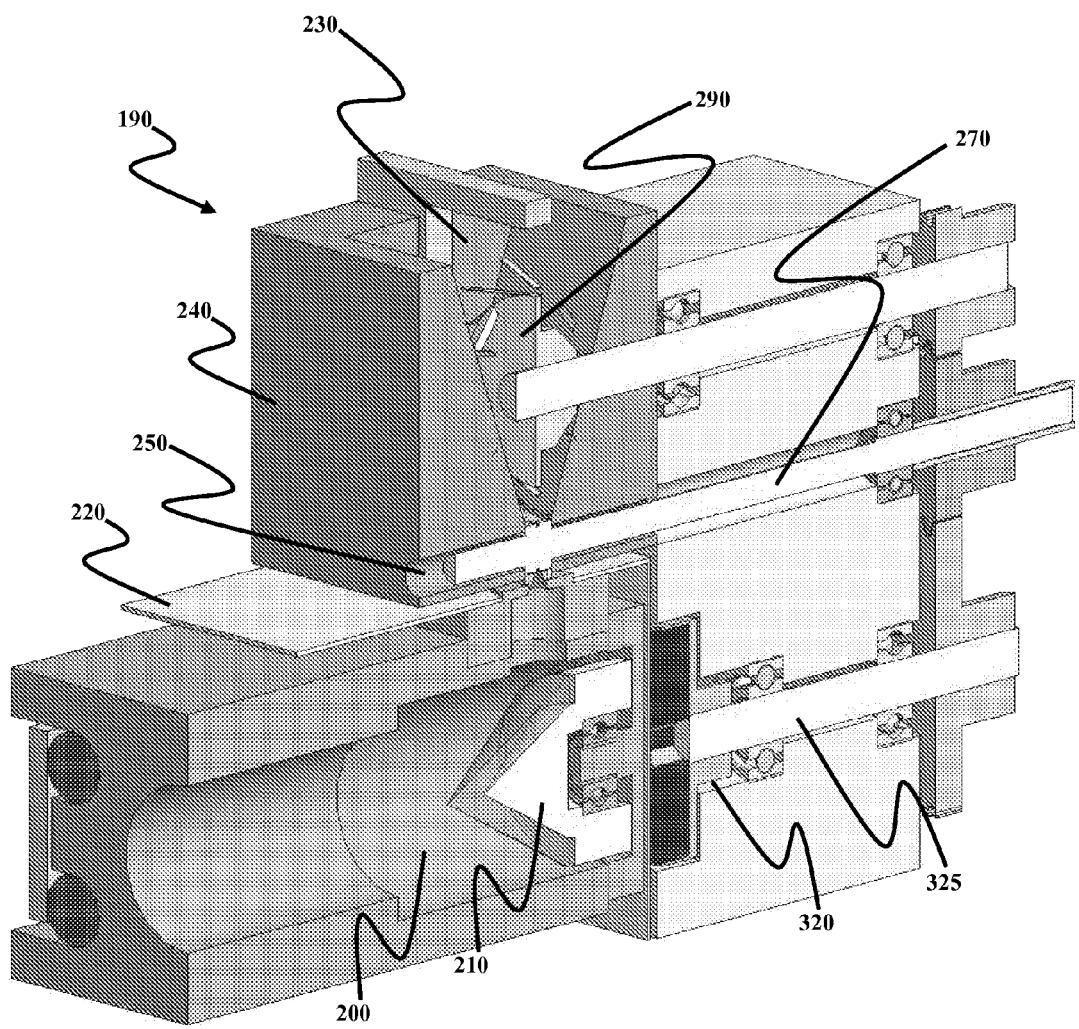
Figure 4:
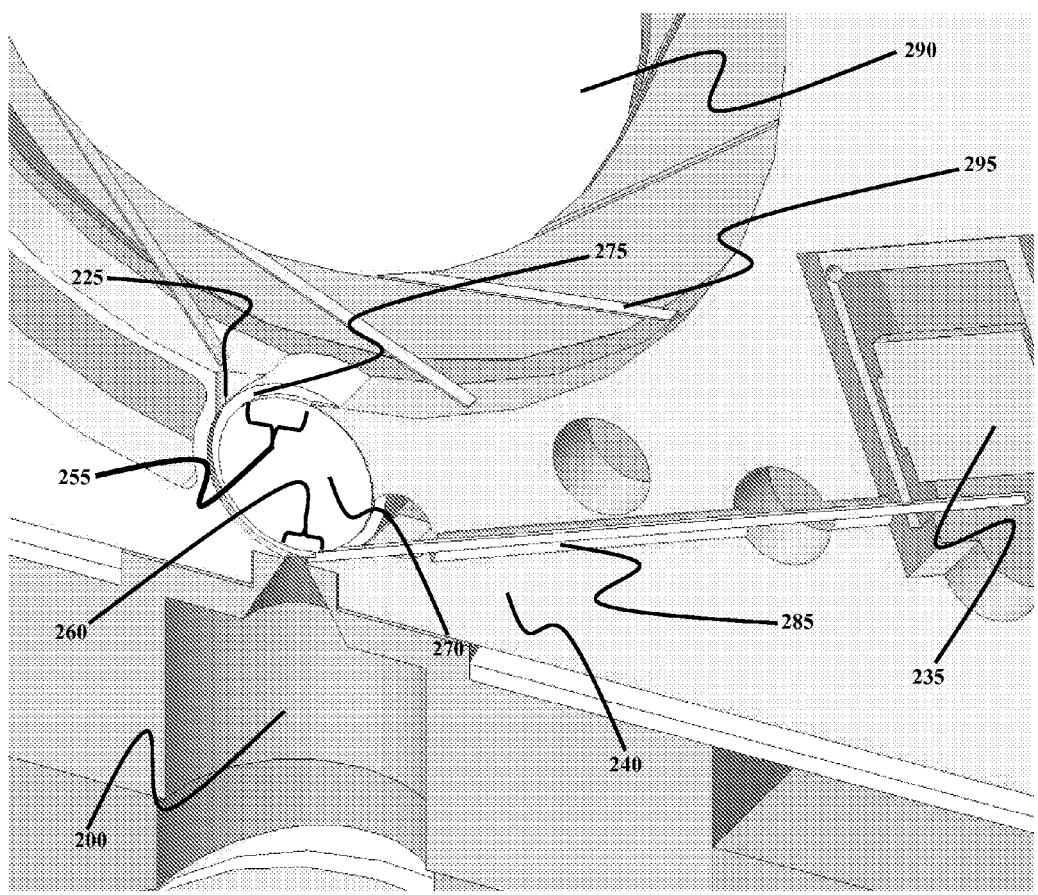
Figure 5:
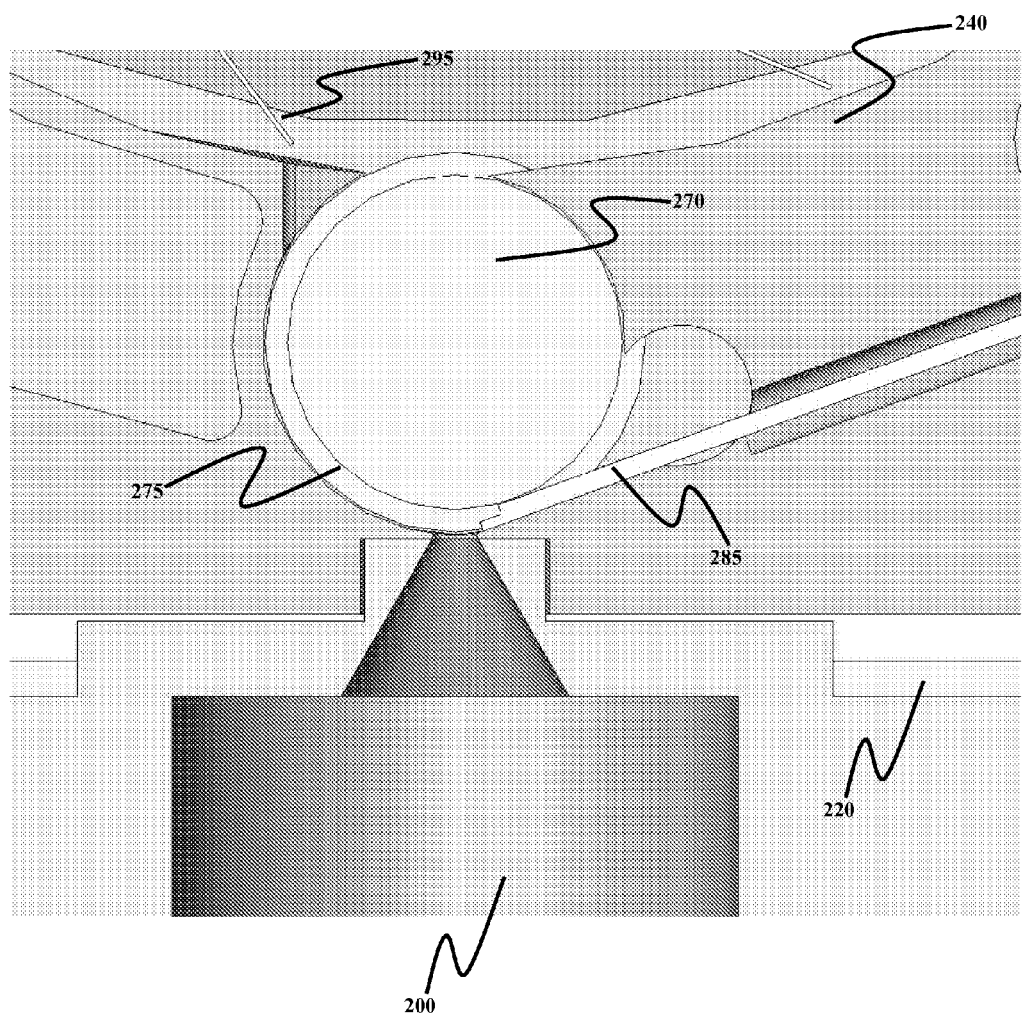
Figure 6:
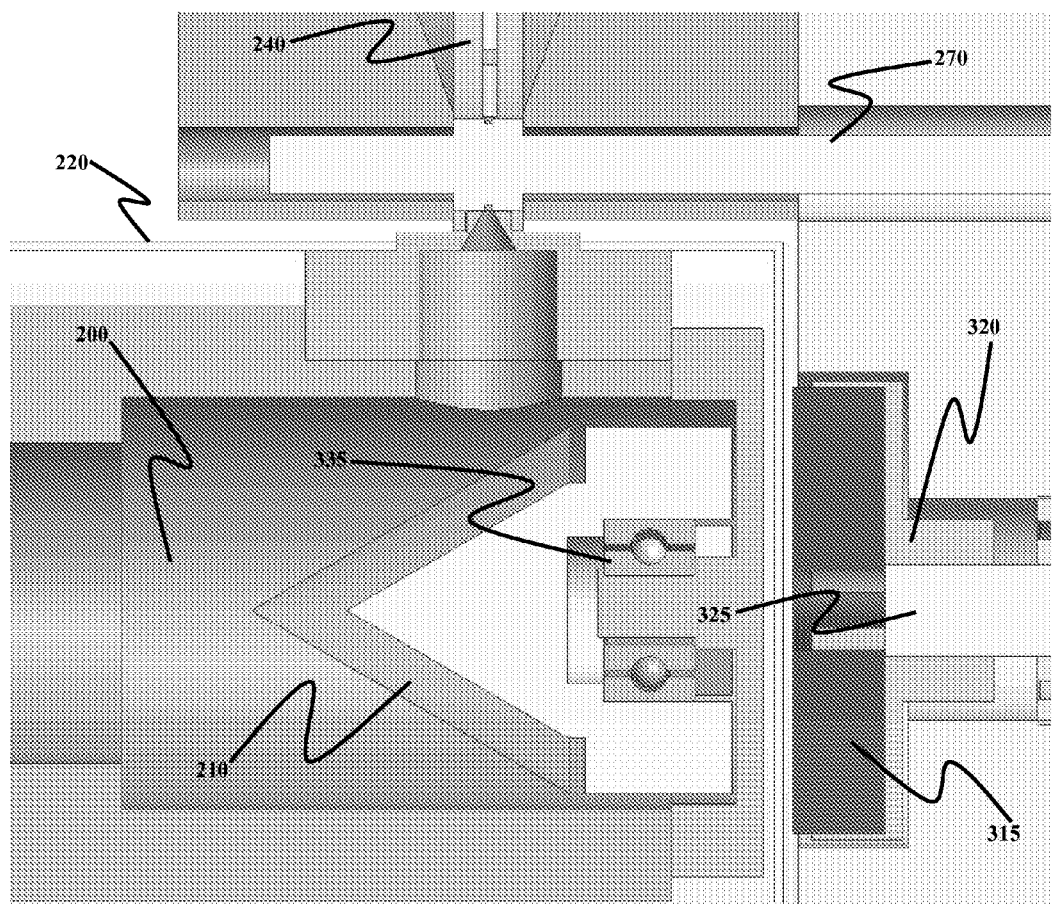
Figure 7:
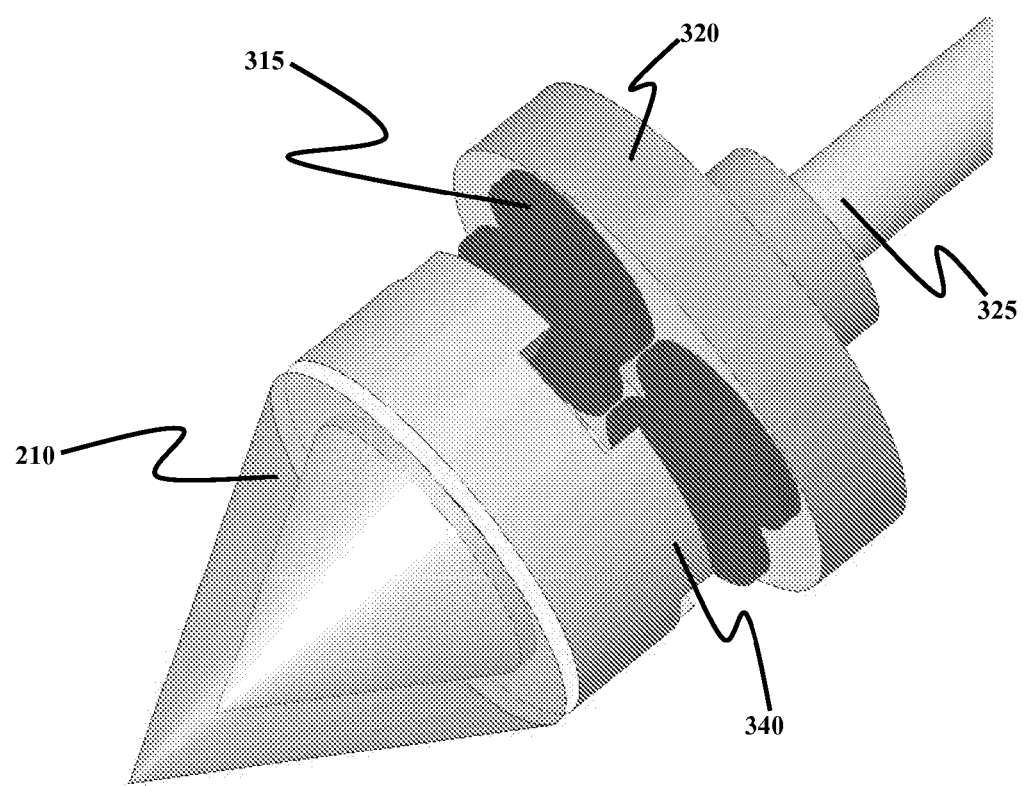

FIG. 1: (Prior Art)

PARTICULATE MATERIAL METERING AND VAPORIZATION

CROSS REFERENCE TO RELATED APPLICATIONS

Reference is made to commonly assigned U.S. patent application Ser. No. 11/970,548 filed Jan. 8, 2008, entitled "Vaporization Apparatus With Precise Powder Metering" by Long et al.; U.S. patent application Ser. No. 11/834,039 filed Aug. 6, 2007, entitled "Vaporization Of Thermally Sensitive Materials" by Long et al.; U.S. patent application Ser. No. 12/271,250 filed Nov. 14, 2008, entitled "Metering of Particulate Material and Vaporization Thereof" by Long et al.; and U.S. patent application Ser. No. 12/271,277 filed Nov. 14, 2008, entitled "Metering and Vaporizing Particulate Material" by Long et al.; the disclosures of which are incorporated herein by reference.

FIELD OF THE INVENTION

The present invention relates to metering of small particle size powdered materials, over a large range of feed rates, into a vaporization apparatus.

BACKGROUND OF THE INVENTION

There is a need to be able to accurately and precisely continuously meter small quantities of powdered materials, for example 1 to 9 micrograms per second. The electronics industry has a need to meter small quantities of particulate materials to a vaporization zone for direct vapor deposition or for precursors in chemical vapor deposition (CVD). There is also a need to be able to accurately and precisely meter material amounts three orders of magnitude higher, for example 1000 micrograms per second. In many systems, it would be advantageous to be able to meter powdered materials over the range of 1 to 1000 micrograms with the same equipment. Organic light emitting diode devices (OLEDs), for instance have a light emitting layer that often contains a host and a dopant that are deposited in amounts differing by two to three orders of magnitude. There would be a great advantage in OLED manufacturing to be able to independently, and continuously, meter powdered organic materials to a vaporization region using a common transport design for host, co-host and dopant materials.

It is well known that precisely metering small amounts of powdered materials is difficult. There are numerous examples of systems that use additional materials as carriers and additives to facilitate the transport of powdered materials. Carriers used include inert gases, liquids, and solids. The use of any additive increases the material transport complexity, for the carrier or additive needs to be added, removed and handled separately from the actual material of interest. The use of carriers also increases the risk of contamination, which is particularly detrimental in the pharmaceutical and electronics manufacturing industries where there is a particular need to meter materials.

In U.S. Pat. No. 3,754,529, Fleischner describes an auger device for transporting powdered material mixed with an inert carrier, preferably sand. The ratio of active material to sand is reported to be 1:9. Transporting a mixture that is mostly inert carrier adds costs and complexities to the system, and increases the potential for contamination of the material feed.

U.S. Patent Application Publication Nos. 2006/0062918 and. 2006/0177576 use a traditional auger design to meter powders, where there is a patterned screw within a smooth barrel. This metering device can also be used as one part of a larger vapor deposition system. Vapor deposition systems of particular interest are those designed for manufacturing organic light emitting diode (OLED) devices. An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal way of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate-dependent vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources, which are heated as little as possible. In this manner, the material is vaporized before it has suffered significant degradation. The limitations with this practice are that the available vaporization rate is very low due to the limitation on heater temperature, and the operation time of the source is very short due to the small quantity of material used. It is then necessary to vent the deposition chamber, disassemble and clean the vapor source, refill the source, reestablish vacuum in the deposition chamber, and degas the just-introduced organic material over several hours before resuming operation. The low deposition rate and the frequent and time-consuming process associated with recharging a source has placed substantial limitations on the throughput of OLED manufacturing facilities.

A secondary consequence of heating the entire organic material charge to roughly the same temperature is that it is impractical to mix additional organic materials, such as dopants, with a host material unless the vaporization behaviors and vapor pressures of the host and dopant are very similar. Additionally, the standard use of separate sources creates a gradient effect in the deposited film where the material in the source closest to the advancing substrate is over-represented in the initial film immediately adjacent the substrate while the material in the last source is over represented in the final film surface. This gradient co-deposition is unavoidable in prior art multiple sources where a single material is vaporized from each source onto a substrate. The gradient in the deposited film is especially evident when the contribution of either of the end sources is more than a few percent of the central source, such as when a co-host is used.

Commonly assigned U.S. Patent Application Publications Nos. 2006/0062918 and. 2006/0062919 overcome many shortcomings of separate point sources by metering materials to a flash vaporization zone. U.S. Patent Application Publication No. 2006/0062918 teaches the metering of host and dopant mixtures in a single powder transport mechanism, and using a manifold to distribute the vapor to the substrate. U.S. Patent Application Publication No. 2006/0062919 discloses the ability to mix organic vapors in the manifold and deliver a mixture of materials to the substrate surface. However, none of these earlier teachings anticipate the need to have independent metering control for the host and dopant materials. The transport mechanisms are therefore unable, by virtue of design, to meter at the low rates, 1-10 micrograms/second, required for an independent dopant feed.

U.S. Patent Application Publication No. 2007/0084700, U.S. Patent Application Publication No. 2006/0157322, U.S. Pat. No. 6,832,887 and U.S. Pat. No. 7,044,288 disclose powder feeding pumps for moving powders from an entry port to a discharge port using parallel spaced disks that rotate within a housing having an internal cavity that defines a volume having an increasing volume from the input port to the discharge port. These powder feeding pumps are intended for use with much larger particle size powders and are not adapted to metering powder on a milligram or microgram basis.

Despite these advances, there continues to be a need to precisely control the metering of milligram to microgram quantities of powdered material into a vaporization apparatus.

SUMMARY OF THE INVENTION

There is a need for precise control of the metering and delivery of milligram to microgram quantities of powder to a vaporization device.

This object is achieved by an apparatus for metering and vaporizing a particulate material, comprising:

(a) a metering apparatus for metering particulate material including:

(i) a reservoir for receiving particulate material;

(ii) a housing having an internal volume and having first and second openings for respectively receiving the particulate material from the reservoir and for discharging the particulate material;

(iii) a rotatable shaft disposed in the internal volume, the shaft having a smooth surface and a circumferential groove aligned with the first and second openings for receiving particulate material from the reservoir and for discharging the particulate material;

(iv) means disposed in the reservoir for delivery and cooperating with the rotating shaft for fluidizing the particulate material and transporting the particulate material from the reservoir into the circumferential groove;

(v) the rotatable shaft and the internal volume cooperating such that the particulate material is substantially transported by the circumferential groove and not along the remainder of the rotatable shaft;

(vi) means disposed in relation to the second opening for scraping, and cooperating with the groove to dislodge particulate material retained therein and fluidize the particulate material, and in response to the shaft rotating, deliver metered amounts of particulate material through the second opening in the form of single particulate grains, or small aggregates of particulate grains, or both; and (b) a flash evaporator that receives and vaporizes the metered particulate material.

It is an advantage of this invention that it can continuously dispense microgram quantities of powder in a vacuum environment and provide controlled volumetric feeding. It is a further advantage of the invention that it can dispense, as single grains or small groups of grains, particulate materials having a wide range of particle sizes including materials having average particle sizes below 30 microns and materials with poor flowability that cannot be dispensed with other dispensing devices such as augers.

BRIEF DESCRIPTION OF THE DRAWINGS

FIG. 1 shows a cross-sectional view of the terminal end of a prior art powder feeding apparatus;

FIG. 2 shows a three-dimensional cross-sectional view of a portion of a different powder feeding apparatus;

FIG. 3 shows a three-dimensional cross-sectional view of one embodiment of a vaporization apparatus according to the present invention;

FIG. 4 shows a three-dimensional cross-sectional view of the vaporization apparatus of FIG. 3 through a different cross-sectional plane;

FIG. 5 shows cross-sectional view of the vaporization apparatus of FIG. 4 in greater detail;

FIG. 6 shows a cross-sectional view of the vaporization apparatus of FIG. 3 illustrating a rotatable flash evaporator therein; and FIG. 7 shows a three-dimensional view of the rotatable flash evaporator of FIG. 6 showing a magnetic coupling for driving the rotatable flash evaporator.

DETAILED DESCRIPTION OF THE INVENTION

U.S. Patent Application Publication Nos. 2006/0062918 and 2006/0177576 use a traditional auger design to meter particulate material to a vaporization apparatus, where there is a patterned screw within a smooth barrel. FIG. 1 shows a cross-sectional view of a typical prior art auger structure showing a patterned auger screw 5 within a smooth auger barrel 7. Auger screw 5 of an auger structure 8 is turned by a motor (not shown). The distance between the threads of the screw helix and the thread height are chosen to be sufficiently large that particulate material tends not to pack into the helix and rotate with it, but rather to remain at the bottom of horizontally oriented auger barrel 7. The particulate material is transported linearly by virtue of the relative motion between auger screw 5 and auger barrel 7. In the horizontal orientation as shown, the particulate material travels primarily along the bottom of auger screw 5 in a tumbling and dispersed form. The terminal end of auger screw 5 can be configured to have a thread-free portion 9 having a constant circular cross section over a small length to constrain the consolidated particulate material to form a narrow annular or tubular shape. One problem with this type of auger structure is varying discharge rate, which has been observed to vary cyclically with the angular orientation of auger screw 5. The quantity of material discharged from revolution to revolution is quite reproducible, but is quite variable within a revolution, leading to variations in vaporization rate of the metered material. In the horizontal orientation, more particulate material resides in the lower half of the auger barrel than in the upper half, which can accentuate the cyclic discharge. Using the auger in a vertical orientation such that the particulate material is evenly distributed around the interior of the auger barrel can attenuate the cyclic discharge, but the cyclical variation remains and the mechanical drive arrangement for the auger and agitator is more complicated. A second problem with this type of particulate material feeding apparatus is that it can generally only be used with materials that are sufficiently free-flowing so as to enable them to be poured from a container in a smooth flow. This generally requires the particulate materials to be sieved so as to have a tightly controlled particle size range. For example, materials where the majority by weight is composed of particles between 50 and 100 microns diameter will generally pour from a container in a smooth flow. In this example, the range of particle sizes is equal to the smallest controlled particle size. Similarly, materials where the majority by weight is composed of particles between 100 and 200 microns diameter will generally pour from a container in a smooth flow. Materials that will not pour smoothly and instead fall in clumps will tend to pack together in the threads of the auger screw after feeding only a small quantity of material and will quickly compact, forming a solid mass that can prevent the auger from turning.

Particulate material flow has been characterized by several methods to indirectly measure the shape, size, uniformity in size and shape, cohesion, arch strength, surface area, and moisture content of the powder particles. Particulate material flow under high vacuum conditions is typically worse than at atmospheric pressures due to the absence of air molecules between the particles. The complex interactions between material particles and the reduced flowability of particles under vacuum conditions has been a limitation in the development of continuous particulate material feeding mechanisms capable of milligram or microgram dispensing accuracy. Particulate material flow is a complex phenomenon that cannot be fully characterized by any single test methodology, but five commonly used methods are described below.

Vibrating Spatula: The method uses a vibrating spatula or trough, which cascades particulate material onto a mass balance. The accumulated material mass is recorded as a function of time. Greater mass accumulated versus time represents better flow.

Angle of Repose: A fixed quantity of particulate material is poured through a funnel from a fixed height onto a level bench top. The particulate material accumulates as a cone and the angle of the side of the cone with the horizontal plane is the angle of repose, where lower angles of repose represent better flow. This method provides an indirect measurement of the shape, size, porosity, cohesion, fluidity, surface area, and bulk properties of the material.

Percent Compressibility Index: A fixed quantity of particulate material is gently poured into a tared graduated cylinder and the initial volume and weight of the material is recorded. The cylinder is placed on a tap density tester and the final volume is recorded after a given number of controlled force taps. Lower percent compressibility values represent better flow. This method provides an indirect measurement of the uniformity in size and shape, deformability, surface area, cohesion, and moisture content of the test materials.

Critical Orifice Diameter: The bottom discharge port of a cylindrical reservoir is fitted with an appropriate orifice diameter ring. The cylindrical reservoir is filled with a fixed volume of sample particulate material by pouring the material through a funnel. The material is left to repose for 30 seconds and then a shutter release lever is slowly turned to the open position. A test is deemed successful if an open cavity is visible through the material sample on three successive tests. The flowability index is given as the diameter of the smallest opening through which the material falls freely. This method is a direct measure of material cohesion and arch strength where smaller values indicate better flow.

Avalanching Method: A fixed volume of material is loaded into a translucent rotating drum and is rotated slowly. A photocell array detector measures total number of avalanches; the average time between avalanches is calculated. Lower average time between avalanches indicates better flow.

Above cited, commonly assigned U.S. patent application Ser. No. 11/970,548 by Long et al. discloses a particulate material feeding apparatus, shown in FIG. 2 in three-dimensional cross-sectional view, that overcomes some of the particulate material feeding limitations encountered previously. This apparatus includes a rotatable shaft 170 in internal volume 150 and having a circumferential groove 175 that receives particulate material from a reservoir with an agitator through a first opening 155. A stationary scraper 185 cooperates with circumferential groove 175 as rotatable shaft 170 rotates to dislodge particulate material from the groove, delivering metered amounts of particulate material through a second opening 160 to a heated flash evaporator 120.

Rotatable shaft 170 is turned by a motor (not shown). An apparatus of this design is well adapted to feeding particulate material having the same narrow particle size range required by the auger structure of the prior art under high vacuum. Free-flowing particulate materials will feed through second opening 160 as individual grains or small groups of grains. Particulate materials with smaller sizes or a wider size distribution can exhibit caking and avalanche flow. Such particulate materials are not fluidized well by the agitator and will not reliably enter into circumferential groove 175 from first opening 155. Any particulate material that does enter the groove can be compacted as it is forced against stationary scraper 185 and can exit second opening 160 as short rods of random lengths. The random volume of the dispensed material rods creates random variations in the vapor flux exiting a vaporization apparatus. These vapor flux variations are not desirable as they can lead to variations in the deposited film thickness.

Stationary scraper 185 is in close proximity to heated flash evaporator 120 and can attain a temperature sufficient to melt some organic powders. The melted particulate material does not fall to flash evaporator 120 as a continuous stream of microgram or milligram particles, but tends to accumulate and fall or flow as irregular volumes. Thus, despite the improvement of the apparatus of FIG. 2 over the prior art in delivering consistent measured quantities of particulate material, there are some materials for which it does not work well. There continues to be a need to precisely control the metering of milligram to microgram quantities of particulate material into a vaporization apparatus.

Turning now to FIG. 3, there is shown a three-dimensional cross-sectional view of one embodiment of an apparatus for vaporizing particulate material according to the present invention. A vaporizing apparatus 190 is an apparatus for metering and vaporizing particulate material and includes a metering apparatus, which meters the particulate material and includes: a reservoir for receiving particulate material; a housing having an internal volume and first and second openings; a rotatable shaft disposed in the internal volume and having a smooth surface, a shape corresponding to that of the internal volume, and a circumferential groove; and a cooled scraper having at its end substantially the same cross section as the groove in the rotating shaft. The metering apparatus further includes an agitator disposed in the reservoir and a mechanism for fluidizing the particulate material that is delivered to the flash evaporator. Vaporizing apparatus 190 further includes a flash evaporator that receives and vaporizes the metered particulate material. These components will be described in more detail.

A reservoir 230 is for receiving particulate material. The particulate material can include a single component, or can include two or more different material components, each one having a different vaporization temperature. Although not shown, reservoir 230 can include a larger storage and feeding apparatus above it to increase the volume of particulate material that can be loaded. Such containers and feeding apparatus have been described by Long et al. in commonly assigned U.S. Pat. No. 7,288,285. Reservoir 230 is in a housing 240 and includes an agitator 290 that fluidizes the particulate material in reservoir 230. Housing 240 is preferably constructed of thermally conductive material, such as aluminum, which can be actively cooled and serves to maintain the particulate material in reservoir 230 at a temperature well below the effective vaporization temperature of the particulate material.

Housing 240 also includes an internal volume 250. A rotatable shaft 270 has a smooth surface and a shape corresponding to that of internal volume 250, e.g. cylindrical in this embodiment, and is disposed in internal volume 250. Rotatable shaft 270 also has a circumferential groove, which shall become apparent in further drawings. Rotatable shaft 270 is preferably constructed of thermally conductive material such as nickel or molybdenum that can be actively cooled and serves to maintain the particulate material in the circumferential groove at a temperature well below the effective vaporization temperature of the particulate material. Hard coatings such as titanium nitride or diamond-like carbon are advantageously applied to internal volume 250 and rotatable shaft 270. A motor (not shown) rotates rotatable shaft 270 at a predetermined rate. The motor can also be used to rotate an agitator 290. Housing 240 also includes first and second openings whose nature and function will become apparent. Vaporizing apparatus 190 also includes a rotatable flash evaporator 210 within a vaporizing chamber 200. A rotatable flash evaporator 210 is driven by a drive shaft 325 via a magnetic coupling 320. A radiation shield 220 is used to thermally isolate a heated vaporizing chamber 200 from the cooled metering apparatus.

The feed rate uniformity is improved when the particulate material in proximity to the infeed portion of rotatable shaft 270 is fluidized by agitation so as to consistently fill the volume of a circumferential groove 275. This can be accomplished by slowly agitating the particulate material with agitator 290 at a rotational speed that can vary depending on the particle size and properties of the particular particulate material. FIG. 4 shows a three-dimensional cross-sectional view of a portion of the apparatus of FIG. 3 in greater detail and shows additional salient features of the present invention. Rotatable shaft 270 has a narrow circumferential groove 275 that is aligned with a first opening 255 and a second opening 260 in housing 240. First opening 255 is for receiving particulate material from the reservoir to circumferential groove 275, and second opening 260 is for discharging the particulate material from circumferential groove 275 to a vaporizing chamber 200. Agitator 290 is a rotating agitator and has a plurality of fine wire agitator tines 295 and is disposed in reservoir 230, which receives particulate material. As the agitator 290 rotates in the clockwise direction in this illustration, agitator tines 295 fluidize the bulk of the particulate material but their extremities act to transport the particulate material from the reservoir into circumferential groove 275. The fluidizing and transporting properties of agitator tines 295 serve to uniformly fill the exposed volume of circumferential groove 275 at first opening 255 with particulate material by preventing material in the reservoir from bridging across the circumferential groove. A wedge-shaped entrance 225, which is at opening 255 in the direction of rotation of rotatable shaft 270, is instrumental in guiding the particulate material into circumferential groove 275. Rotatable shaft 270 is sized to be nearly the diameter of the internal volume in housing 240. In this way, the rotatable shaft and the internal volume cooperate to substantially transport particulate material by circumferential groove 275 and not along the remainder of rotatable shaft 270. Agitator 290 and rotatable shaft 270 can be connected, e.g. by gears, so as to rotate in opposite directions and thereby continuously transport particulate material from reservoir 230, through first opening 255, into circumferential groove 275 and then to second opening 260 where the particulate material is discharged into vaporizing chamber 200. The internal volume in housing 240 is a close fit to rotatable shaft 270. The rotatable shaft and the internal volume cooperate as rotatable shaft 270 turns to remove particulate material projecting radially beyond circumferential groove 275. The particulate material thus precisely fills the circumferential groove with a highly controlled volume of material. An oscillating scraper 285 is disposed at second opening 260 and has at its end substantially the same cross-section as circumferential groove 275. Oscillating scraper 285 cooperates with the groove to dislodge the particulate material retained in the groove as rotatable shaft 270 rotates, forcing the particulate material out second opening 260. Oscillating scraper 285 oscillates along its length to fluidize the particulate material at second opening 260 so that in response to the shaft rotating, metered amounts of the discharged particulate material fall as small particles, e.g. in the form of small particulate grains, or small aggregates of particulate grains, or both, into the vaporizing chamber 200 instead of falling as random length rods. The frequency and amplitude of oscillation can be varied through an actuator 235 to optimally agitate or fluidize the particulate material at second opening 260 so that it is dispensed as small particles of uniform volume, e.g. single particulate grains or small aggregates of particulate grains, or both. The oscillation imparts additional velocity to the material particles such that they fall faster than by gravity alone and fall at various angles relative to the metering apparatus. Dispersing the material particles over various angles by this method causes the particles to cover a larger area of rotatable flash evaporator 210, thereby minimizing the tendency for particles to accumulate on top of each other. The material particles drop onto rotatable flash evaporator 210, at a frequency controlled by the oscillating scraper and a volumetric feed rate controlled by the angular velocity of rotatable shaft 270, and vaporize upon contact. In FIG. 3, rotatable flash evaporator 210 is desirably an open cell, reticulated vitreous carbon structure having a cylindrical or conical shape, but can also take the form of a solid cylinder or cone having a series of fine circumferential or spiral grooves on its surface. Conical rotatable flash evaporator 210 can be rotated through a magnetic coupling 320 geared to rotatable shaft 270 as shown in FIG. 3. Rotatable flash evaporator 210 effectively disperses the particulate material over a larger heated area than if the cone were stationary. This permits material particles to fall directly on the surface of rotatable flash evaporator 210 and vaporize more rapidly than if the particles were to fall on each other. At high particulate material feed rates, particles falling on a stationary vaporization element can accumulate as they fall on previously dispensed particles. This accumulation can create an insulation layer that hinders flash vaporization and can lead to material degradation because of longer residence time of the particulate material at elevated temperatures. Providing direct access to the flash evaporator for each material particle provides the most rapid vaporization and minimizes degradation of the particulate material.

As the particulate material is dispensed into vaporizing chamber 200 and is vaporized, molecules of the vapor travel in every direction, rebounding off the heated walls of the vaporizing chamber until the majority exit and condense on the surface of a substrate. However, a portion of the molecules in vaporizing chamber 200 will condense on the cooler just-dispensed particulate material as it enters the vaporizing chamber, on the particulate material covering oscillating scraper 285 and on the particulate material in circumferential groove 275. This condensate will be vaporized a second time as the particulate material falls into vaporizing chamber 200. The condensate can bind the otherwise loosely consolidated particulate material exiting second opening 260, increasing the probability that the particulate material will fall as random length rods instead of finely divided particles. To the extent that oscillating scraper 285 is shielded by cool material particles, it will collect little or no condensate, and any condensate it collects can be removed by the oscillating motion of the scraper relative to housing 240. The motion of oscillating scraper 285 tends to dislodge, on a continual basis, condensate that can accumulate in second opening 260 and can additionally dislodge any condensate that can accumulate at the opening of vaporizing chamber 200. This condensate can otherwise accumulate and impede the steady ingress of particulate material particles to vaporizing chamber 200.

FIG. 5 shows a cross-sectional view of the vaporization apparatus of FIG. 4 in greater detail. Axial motion imparted to oscillating scraper 285 fluidizes the consolidated particulate material exiting from second opening 260, thereby preventing the particulate material from entering vaporizing chamber 200 as clumps. Oscillating motion imparted to oscillating scraper 285 by actuator 235 can be effective in dislodging condensate from the scraper, as well as from second opening 260 and the adjacent opening to vaporizing chamber 200.

FIG. 6 shows a cross-sectional view of the vaporization apparatus of FIG. 3 illustrating a rotatable flash evaporator therein. Rotatable flash evaporator 210 has a conical shape and its magnetic coupling can be seen. As described previously, conical flash evaporator 210 can be constructed of reticulated vitreous carbon foam, ceramic foam such as silicon carbide foam, or metal foam such as nickel foam. Conical flash evaporator can also be constructed from a solid ceramic or metal material having a series of fine circumferential or spiral grooves on its surface. Such grooves facilitate the retention of fine material particles until they vaporize from the rotating cone surface. The use of such reticulated material structure, e.g. vitreous carbon, has been described by Long et al. incommonly-assigned U.S. patent application Ser. No. 11/834,039.

FIG. 7 shows a three-dimensional view of the rotatable flash evaporator of FIG. 6 showing the magnetic coupling 320 for rotating rotatable flash evaporator 210 inside of vaporizing chamber 200 without physical contact between the cold magnetic drive coupling and the hot vaporization element or breach of the vapor integrity of vaporizing chamber 200. The coupling includes several magnets 315, attached to a rotating drive shaft 325 via magnetic coupling 320, that cooperate with drive lugs 340 attached to rotatable flash evaporator 210. The flash evaporator and its attached drive lugs are supported on a ceramic bearing (bearing 335 in FIG. 6). The non-contact, magnetic drive between hot rotatable flash evaporator 210 and cold rotary drive shaft 325 prevents heat flow between them, thereby permitting rotatable flash evaporator 210 to be heated by radiation from vaporizing chamber 200 without requiring the use of additional heating elements that rotate with the flash evaporator or the complication of slip rings to transfer power to the additional heating elements. Magnetic coupling 320 further eliminates the need to seal around the rotary drive connection to rotatable flash evaporator 210. The magnetic coupling is effective at temperatures in excess of 600° C. because the magnets 315 are shielded and remain cold while the low carbon steel drive lugs 340 retain their low magnetic reluctance at temperatures approaching 700° C.

The invention has been described in detail with particular reference to certain preferred embodiments thereof, but it will be understood that variations and modifications can be effected within the spirit and scope of the invention.

PARTS LIST

5 auger screw
7 auger barrel
8 auger structure
9 thread-free portion
120 flash evaporator
150 internal volume
155 first opening
160 second opening
170 rotatable shaft
175 circumferential groove
185 stationary scraper
190 vaporizing apparatus
200 vaporizing chamber
210 rotatable flash evaporator
220 radiation shield
225 wedge-shaped entrance
230 reservoir
235 actuator
240 housing
250 internal volume
255 first opening
260 second opening
270 rotatable shaft
275 circumferential groove
285 oscillating scraper
290 agitator
295 agitator tines
315 magnet
320 magnetic coupling
325 drive shaft
335 bearing
340 drive lugs

The invention claimed is:

1. Apparatus for metering and vaporizing a particulate material, comprising:

(a) a metering device for metering particulate material including:

(i) a reservoir for receiving particulate material;

(ii) a housing having an internal volume and having first and second openings for respectively receiving the particulate material from the reservoir and for discharging the particulate material;

(iii) a rotatable shaft disposed in the internal volume, the shaft having a smooth surface and a circumferential groove aligned with the first and second openings for receiving particulate material from the reservoir and for discharging the particulate material;

(iv) means disposed in the reservoir for delivery and cooperating with the rotating shaft for fluidizing the particulate material and transporting the particulate material from the reservoir into the circumferential groove;

(v) the rotatable shaft and the internal volume cooperating such that the particulate material is transported by the circumferential groove and not along the remainder of the rotatable shaft;

(vi) means disposed in relation to the second opening for scraping, and cooperating with the groove to dislodge particulate material retained therein and fluidize the scraped particulate material, and in response to the shaft rotating, deliver metered amounts of particulate material through the second opening in the form of single particulate grains, or small aggregates of particulate grains, or both; and (b) a flash evaporator that receives and flash vaporizes the metered particulate material.

2. The apparatus of claim 1, wherein the means for delivery comprises a rotating agitator with a plurality of tines that act to transport the particulate material from the reservoir to the circumferential groove.

3. The apparatus of claim 1, wherein the scraping and fluidizing means comprises an oscillating scraper having at its end substantially the same cross section as the groove in the rotating shaft.

4. The apparatus of claim 1, wherein the flash evaporator is rotatable.

5. The apparatus of claim 4, wherein the flash evaporator is rotated via a magnetic coupling.

\* \* \* \* \*